(12) United States Patent
Yoo

(10) Patent No.: US 10,582,308 B2
(45) Date of Patent: Mar. 3, 2020

(54) HIGH SENSITIVITY MICROPHONE AND MANUFACTURING METHOD THEREOF

(71) Applicants: HYUNDAI MOTOR COMPANY, Seoul (KR); KIA MOTORS CORPORATION, Seoul (KR)

(72) Inventor: Ilseon Yoo, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/371,645

(22) Filed: Apr. 1, 2019

(65) Prior Publication Data

US 2019/0230447 A1    Jul. 25, 2019

Related U.S. Application Data

(62) Division of application No. 15/373,176, filed on Dec. 8, 2016, now abandoned.

(30) Foreign Application Priority Data

Sep. 9, 2016    (KR) .................... 10-2016-0116721

(51) Int. Cl.
*H04R 19/04*    (2006.01)
*H01L 51/00*    (2006.01)
(Continued)

(52) U.S. Cl.
CPC ........... *H04R 19/04* (2013.01); *B81B 3/0075* (2013.01); *B81C 1/00158* (2013.01);
(Continued)

(58) Field of Classification Search
CPC .............. B81B 3/0075; B81C 1/00158; H01L 51/0048; H04R 19/04; H04R 19/005
(Continued)

(56) References Cited

U.S. PATENT DOCUMENTS 6,667,189 B1    12/2003    Wang
7,728,947 B1    6/2010    Kim
(Continued)

FOREIGN PATENT DOCUMENTS

JP    2009-089100 A    4/2009
KR    10-0394016 B1    8/2003
(Continued)

OTHER PUBLICATIONS

Final Office Action issued in corresponding U.S. Appl. No. 15/373,176 dated Jan. 2, 2019.
(Continued)

*Primary Examiner* — Binh X Tran
(74) *Attorney, Agent, or Firm* — Morgan, Lewis & Bockius LLP

(57) ABSTRACT

A high sensitivity microphone includes a substrate having a through portion provided in a central portion thereof, a vibration membrane disposed on the substrate and covering the through portion, a fixed membrane installed above the vibration membrane, spaced apart from the vibration membrane with an air layer interposed therebetween, and having a plurality of air inlets perforated in a direction toward the air layer, and a plurality of support posts provided as vertical elastic posts between the fixed membrane and the vibration membrane and mechanically fixing the vibration membrane by a frictional force, regardless of an applied voltage.

8 Claims, 8 Drawing Sheets

(51) Int. Cl.
  *H04R 19/00* (2006.01)
  *H04R 31/00* (2006.01)
  *B81B 3/00* (2006.01)
  *B81C 1/00* (2006.01)
(52) U.S. Cl.
  CPC ....... *H01L 51/0048* (2013.01); *H04R 19/005* (2013.01); *H04R 31/00* (2013.01); *B81B 2201/0257* (2013.01); *B81B 2203/0127* (2013.01); *B81C 2201/013* (2013.01); *B81C 2201/0109* (2013.01); *H04R 31/003* (2013.01); *H04R 2201/003* (2013.01)
(58) Field of Classification Search
  USPC .............................. 216/2, 56, 79, 80, 97, 99
  See application file for complete search history.

(56) References Cited

U.S. PATENT DOCUMENTS

| | | | |
|---|---|---|---|
| 8,174,085 B2 | 5/2012 | Nakatani | |
| 8,783,113 B2 * | 7/2014 | Robert | B81B 3/0021 73/700 |
| 2006/0093171 A1 | 5/2006 | Zhe | |
| 2009/0167107 A1 | 7/2009 | Huang | |
| 2011/0075865 A1 * | 3/2011 | Yang | H04R 19/005 381/174 |
| 2012/0091544 A1 * | 4/2012 | Reichenbach | H04R 19/005 257/416 |
| 2015/0060955 A1 * | 3/2015 | Chen | H04R 19/04 257/254 |
| 2015/0109889 A1 | 4/2015 | Chen | |
| 2015/0296306 A1 | 10/2015 | Shao | |
| 2016/0150319 A1 * | 5/2016 | Yoo | H04R 19/005 381/92 |

FOREIGN PATENT DOCUMENTS

| | | |
|---|---|---|
| KR | 10-1610129 B1 | 4/2016 |
| KR | 10-1619253 B1 | 5/2016 |

OTHER PUBLICATIONS

Office Action issued in corresponding U.S. Appl. No. 15/373,176 dated Oct. 18, 2018.

* cited by examiner

FIG. 1  - Prior Art -

FIG. 4
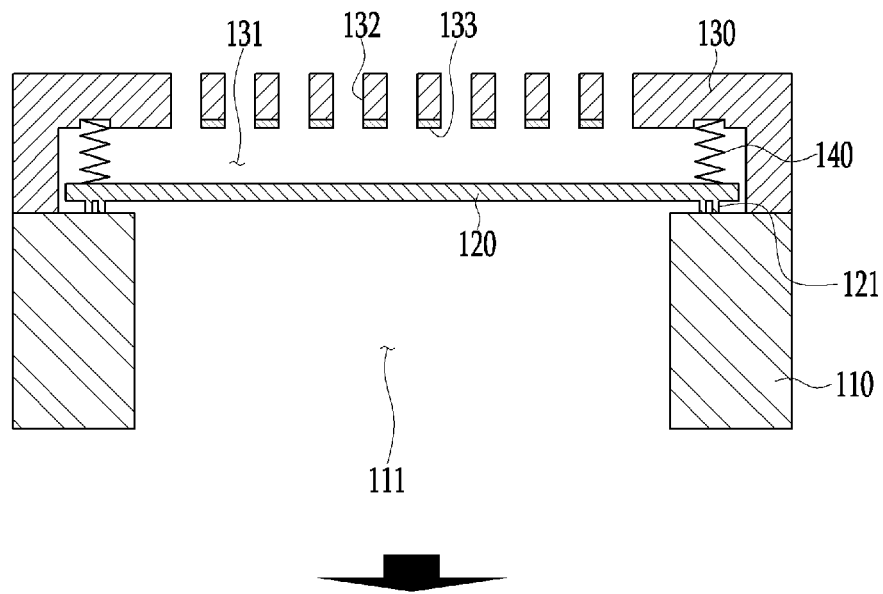
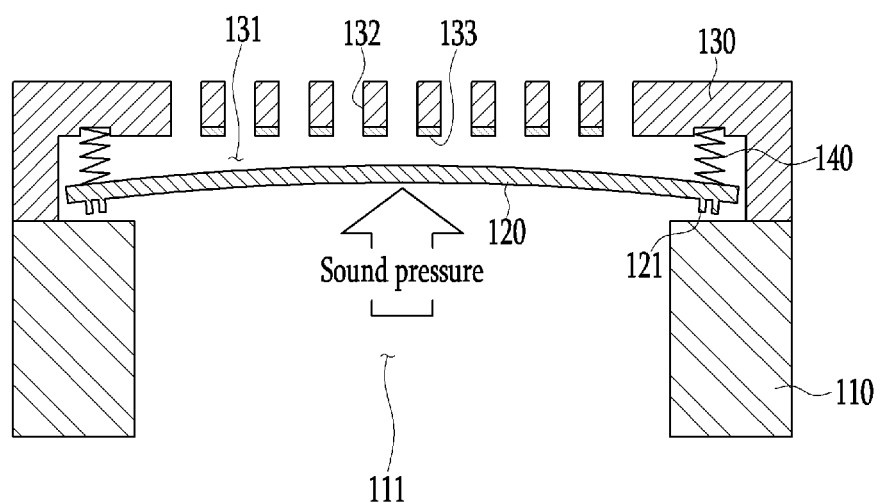

HIGH SENSITIVITY MICROPHONE AND MANUFACTURING METHOD THEREOF

CROSS-REFERENCE TO RELATED APPLICATION

This application is a Divisional of U.S. patent application Ser. No. 15/373,176 filed Dec. 8, 2016 which claims priority to and the benefit of Korean Patent Application No. 10-2016-0116721 filed in the Korean Intellectual Property Office on Sep. 9, 2016, the entire content of which is incorporated herein by reference.

TECHNICAL FIELD

The present disclosure relates to a high sensitivity microphone and a manufacturing method thereof.

BACKGROUND

In general, a microphone refers to a device converting a sound such as a voice therearound into an electrical signal and processing the electrical signal to a signal enabling a human being or a machine finally to recognize the sound.

As microphones converting an audio signal into an electrical signal, capacitive and piezoelectric type microphones have been developed.

The capacitive type microphone includes a micro-electrochemical system (MEMS) in which a fixed membrane and a vibration membrane are spaced apart from each other. In the MEMS, when a sound pressure is applied to the vibration membrane, a space between the fixed membrane and the vibration membrane is changed to cause a capacitive value to be changed to generate an electrical signal, and the sound pressure is measured with the electrical signal.

Compared with an existing electrets condenser microphone (ECM), the capacitive type MEMS microphone is advantageous in that performance thereof is less changed over a change in an external environment such as a temperature or humidity and performance variations of products are small due to a semiconductor batch process.

Further, most capacitive type MEMS microphones have stable frequency response characteristics and excellent sensitivity. In the capacitive type microphone, a change in capacitance between a vibration membrane and a fixed membrane is measured and output as a voltage signal, and it is expressed as sensitivity, one of major performance indices.

In order to enhance sensitivity, it is designed to lower residual stress of a vibration membrane, and to this end, a free-floating membrane structure has been researched.

FIG. 1 is a view illustrating a free-floating membrane structure of a commercialized MEMS microphone according to a related art.

Referring to FIG. 1, a general free-floating membrane structure includes a vibration membrane 3, in a state of not being fixed, between a substrate 1 and a fixed membrane 2, deviating from a concept of an existing clamped capacitive type vibration membrane.

With this structure, since the vibration membrane 3 is not restrained between the substrate 1 and the fixed membrane 2 after all the processes are finished, a vibration membrane residual stress, one of the most important factors determining sensitivity of the MEMS microphone, may be removed.

In the vibration membrane structure without a residual stress, the vibration membrane 3 is fixed by electrostatic force based on an applied voltage (i.e., a driving voltage) by applying a rigid support post 4 to the free-floating membrane 3 and the fixed membrane 2.

In detail, when a driving voltage (bias) is applied to the microphone, the vibration membrane 3 is attracted toward the fixed membrane 2 due to an electrostatic force and attached and fixed to the support post 4 to vibrate by a sound pressure. When the driving voltage is not applied, the vibration membrane 3 is separated from the support post 4 and lowered to the substrate 1 because the electrostatic force is released.

However, when the related art microphone is not driven, the vibration membrane 3 is not fixed and free between the substrate 1 and the fixed membrane 2, and thus, the vibration membrane 3 may be damaged due to an impact.

Stress caused as the vibration membrane 3 is repeatedly brought into contact with or separated from the fixed membrane 2, and the support post 4 according to driving/non-driving of the microphone may degrade durability.

In addition, due to the clamped structure in which the vibration membrane 3 is fixed to the rigid support post 4 when the microphone is driven, it is not easy to adjust rigidity, making it difficult to additionally enhance sensitivity.

Matters described in the background art section are provided to promote understanding of the background of the present disclosure, which may include a matter that is not a prior art known to those skilled in the art to which the present disclosure pertains.

SUMMARY

The present disclosure has been made in an effort to provide a highly sensitive microphone having advantages of preventing an impact regardless of an applied voltage by mechanically fixing a vibration membrane through an elastic support post and increasing a vibration displacement when a vibration membrane is vibrated by a sound pressure by providing rigidity changed according to a sound pressure, and a manufacturing method thereof.

According to an example embodiment of the present disclosure, a high sensitivity microphone includes: a substrate having a through portion provided in a central portion thereof; a vibration membrane disposed on the substrate and covering the through portion; a fixed membrane installed above the vibration membrane, spaced apart from the vibration membrane with an air layer interposed therebetween, and having a plurality of air inlets perforated in a direction toward the air layer; and a plurality of support posts provided as vertical elastic posts between the fixed membrane and the vibration membrane and mechanically fixing the vibration membrane by a frictional force, regardless of an applied voltage.

The support posts may be formed of carbon nanotube (CNT) patterned between the fixed membrane and the vibration membrane and arranged at a predetermined interval in a circular shape from a central point of the fixed membrane.

The support posts may serve as springs with rigidity deformed by a sound pressure and may be simultaneously deformed together with the vibration membrane by a sound pressure.

The vibration membrane may have a free-floating membrane structure whose contacts with respect to the support posts and the substrate are not attached.

The vibration membrane may have a depression and protrusion portion provided on a lower edge thereof to prevent attachment of the vibration membrane to the substrate.

A support portion of the fixed membrane vertically extending from an edge thereof may be installed on the substrate.

The fixed membrane may have a fixed electrode disposed on a lower surface thereof and perforated in the same pattern as that of the air inlets.

According to another exemplary embodiment of the present disclosure, a method for manufacturing a high sensitivity microphone includes operations of: a) forming a first sacrificial layer on a substrate and forming a vibration membrane thereon; b) forming a second sacrificial layer on the vibration membrane and patterning carbon nanotube (CNT) seeds on opposing sides of the second sacrificial layer; c) forming a fixed membrane on the substrate including the CNT seeds and the second sacrificial layer; d) etching the fixed membrane to generate a plurality of perforated air inlets; and e) removing the first sacrificial layer and the second sacrificial layer and growing the CNT seeds to form a plurality of CNT support posts as vertical elastic posts between the fixed membrane and the vibration membrane to mechanically fix the vibration membrane by a frictional force, regardless of an applied voltage.

The operation a) may include: etching a portion of the first sacrificial layer to pattern a plurality of recesses; and forming a depression and protrusion portion by the plurality of recesses formed in the first sacrificial layer under the vibration membrane.

The operation b) may include: patterning a fixed electrode in a central portion of the second sacrificial layer.

In the operation d), the fixed membrane and the fixed electrode may be etched to generate a plurality of air inlets perforated in the same pattern.

The operation d) may include etching a rear side of the substrate to form a through portion to which a sound pressure is input from the outside.

The vibration membrane may be formed as a monolayer membrane using polysilicon or a silicon nitride or may be formed as a multi-layer membrane by alternately stacking polysilicoin and a silicon nitride.

The first sacrificial layer and the second sacrificial layer may be formed of any one of a photosensitive material, a silicon oxide, and a silicon nitride.

The operation e) may include: removing the first sacrificial layer to position the vibration membrane in a state of not being attached to the substrate; and fixing the vibration membrane positioned in a non-attached manner on the substrate by a frictional force of the CNT support posts.

According to the exemplary embodiment of the present disclosure, since the patterned CNT support posts are formed between the fixed membrane and the vibration membrane to mechanically fix the vibration membrane by a frictional force of the CNT support post, regardless of an applied voltage, an impact applied to the vibration membrane may be prevented and durability may be enhanced.

In addition, since the patterned CNT support posts serve as springs with a structure having optimized rigidity to increase a vibration displacement when the vibration membrane is vibrated by a sound pressure, an effect of enhancing sensitivity may be maximized.

In addition, application of high durability and high sensitivity microphone according to an exemplary embodiment of the present disclosure to a vehicle may enhance performance of electronic equipment based on sound recognition, whereby enhancement of customer satisfaction of products may be anticipated.

BRIEF DESCRIPTION OF THE DRAWINGS

FIG. 4 is a cross-sectional view illustrating an operation principle of a microphone when a sound pressure is input according to an exemplary embodiment of the present disclosure.

DETAILED DESCRIPTION OF THE EMBODIMENTS

Figure 1:
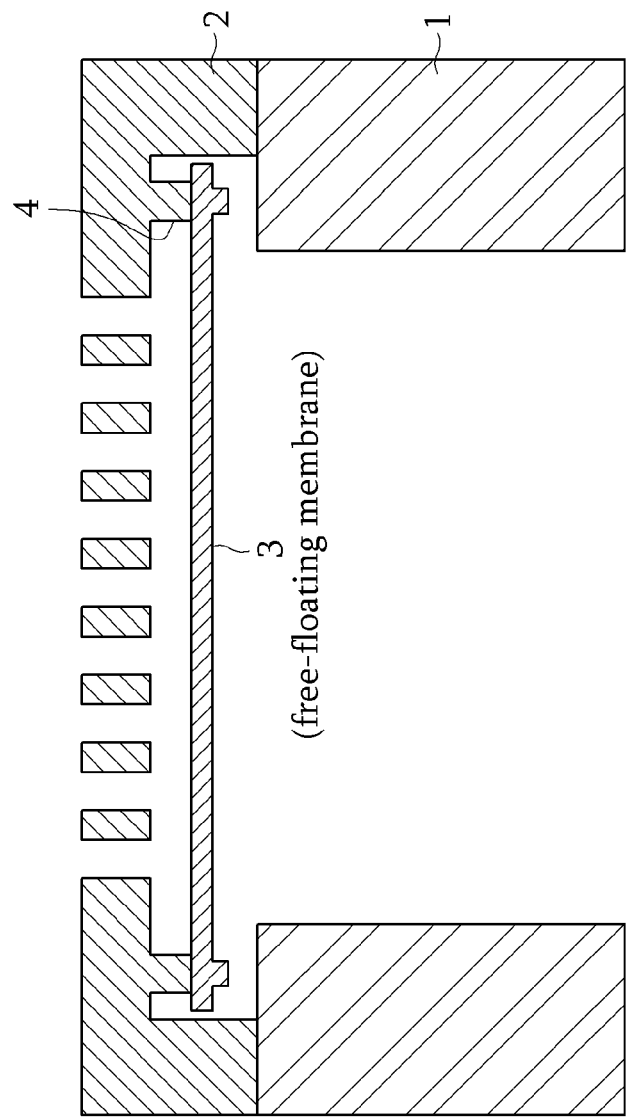
FIG. 1 is a view illustrating a free-floating membrane structure of a related art commercialized micro-electro-chemical system (MEMS) microphone.

In the following detailed description, only certain example embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive. Like reference numerals designate like elements throughout the specification.

Throughout the specification, unless explicitly described to the contrary, the word "comprise" and variations such as "comprises" or "comprising", will be understood to imply the inclusion of stated elements but not the exclusion of any other elements. In addition, the terms "-er", "-or" and "module" described in the specification mean units for processing at least one function and operation and can be implemented by hardware components or software components and combinations thereof.

Hereinafter, a highly sensitive microphone and a manufacturing method thereof according to exemplary embodiments of the present disclosure will be described in detail with reference to the accompanying drawings.

Figure 2:
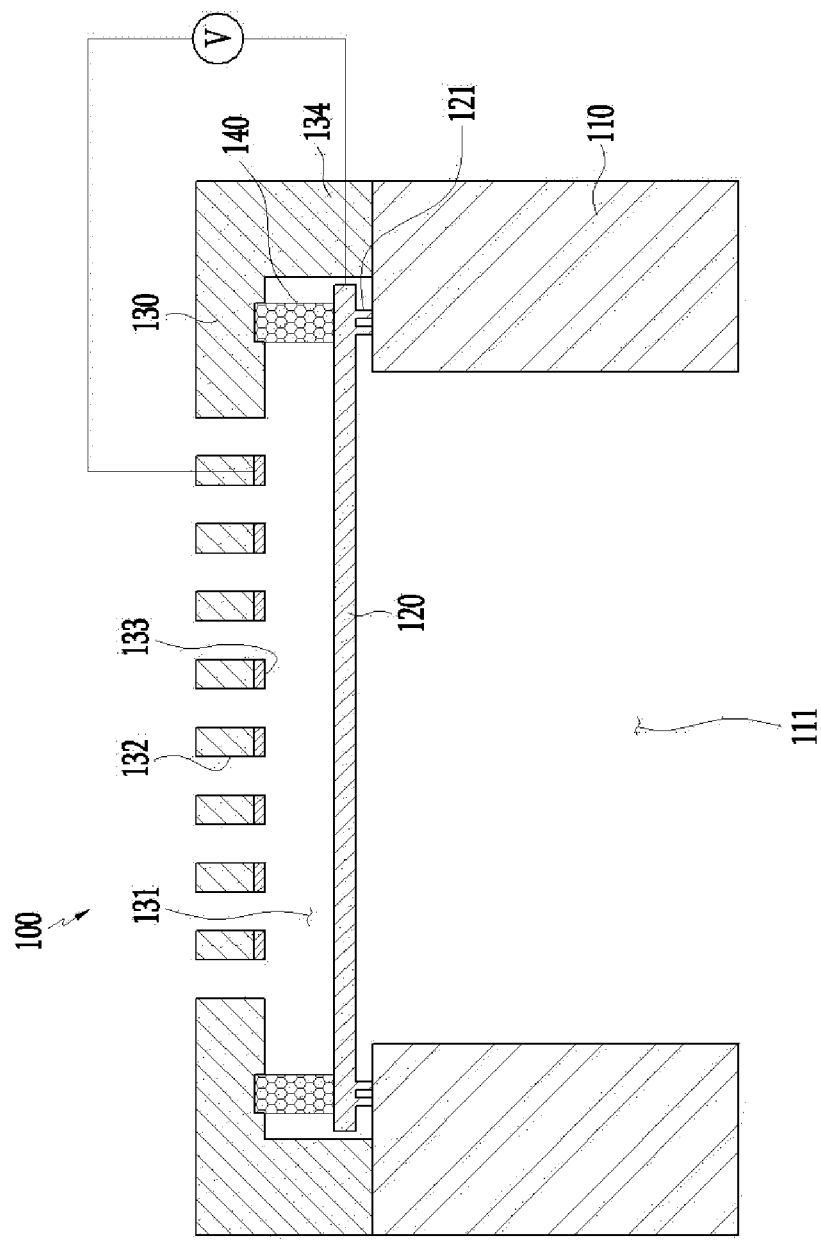
FIG. 2 is a schematic cross-sectional view of a microphone according to an exemplary embodiment of the present disclosure.

FIG. 2 is a schematic cross-sectional view of a microphone according to an exemplary embodiment of the present disclosure.

Figure 3:
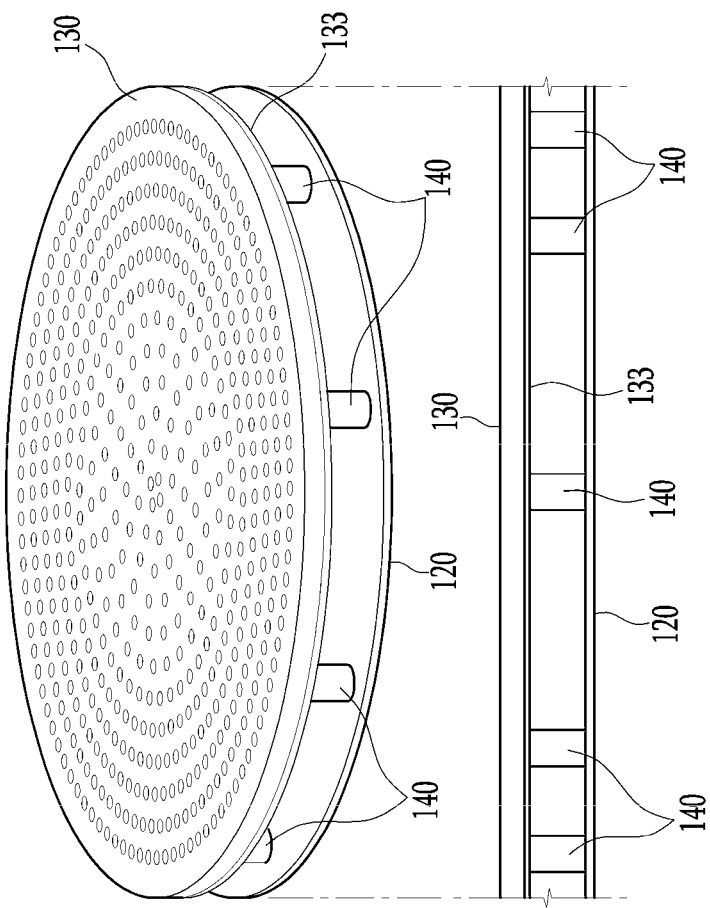
FIG. 3 is a perspective view and a side view schematically illustrating a fixed membrane, a vibration membrane, and a support according to an exemplary embodiment of the present disclosure.

FIG. 3 is a perspective view and a side view schematically illustrating a fixed membrane, a vibration membrane, and a support according to an exemplary embodiment of the present disclosure.

Referring to FIGS. 2 and 3, a microphone 100 according to an exemplary embodiment of the present disclosure includes a substrate 110, a vibration membrane 120, a fixed membrane 130, and a carbon nanotube (CNT) support post 140.

The substrate 110 may be formed of silicon and have a through portion provided in a central portion thereof to which a sound pressure is input.

The vibration membrane 120 covers the through portion 111 on the substrate 110.

Thus, the vibration membrane 120 is partially exposed by the through portion 111 formed in the substrate 110, and the exposed portion of the vibration membrane 120 is vibrated by a sound pressure transferred from the outside.

The vibration membrane 120 includes protrusion and depression portions (dimples) 121 provided at a lower edge thereof placed on the substrate in order to prevent attachment of the vibration membrane 120 to the substrate 110. The protrusion and depression portions 121 may have at least one protrusion.

The vibration membrane 120 may serve as an electrode by itself, or may have a separate vibration electrode (not shown) disposed in an upper portion thereof. Here, the vibration electrode may be vibrated together with the vibration membrane 120 when a sound pressure is input.

The vibration membrane 120 may have a monolayer membrane structure formed of polysilicon or silicon nitride (SiNx) film. Further, without being limited thereto, the vibration membrane 120 may have a multi-layer film structure in which polysilicon and silicon nitride film are alternately stacked.

The fixed membrane 130 is installed above the vibration membrane 120 and spaced apart from the vibration membrane 120 with an air layer 131 interposed therebetween, and a support portion 134 vertically extending from the fixed membrane 130 is installed on the substrate 110 in order to support the fixed membrane 130 (however, in order to show the CNT support post 140, the support portion is omitted in FIG. 3).

Accordingly, the fixed membrane 130 has a casing structure having a diameter greater than that of the vibration membrane 120 and covering the vibration membrane 120 placed on the substrate 110.

The fixed membrane 130 includes a plurality of air inlets 132 perforated in a direction toward the air layer 131.

A fixed electrode 133 is disposed on a lower portion of the fixed membrane 130 and is perforated in the same pattern as that of the air inlets 132.

That is, the fixed membrane 130 and the fixed electrode 133 include a plurality of air inlets 132 perforated in the same pattern. Here, since the plurality of air inlets 132 allow for an air flow, the fixed membrane 130 and the fixed electrode 133 are not vibrated by a sound source.

The CNT support post 140 is formed as a vertical elastic post between the fixed membrane 130 and the vibration membrane 120, and mechanically fixes the vibration membrane 120, regardless of an applied voltage.

The CNT support post 140, a carbon nanotube (CNT) patterned between the fixed membrane 130 and the vibration membrane 120, mechanically fixes the vibration membrane 120 by a frictional force.

The CNT support posts 140 are arranged at a uniform interval in a circular shape based on a central point of the fixed membrane 130.

The CNT support post 140 may be able to fix the vibration membrane 120, regardless of an applied voltage (i.e., driving/non-driving) in the related art, by growing a CNT seed formed on a lower portion of the fixed membrane 130 and applying a frictional force to an upper portion of the vibration membrane 120 through a follow-up process in manufacturing a micro-electrochemical system (MEMS).

Here, the vibration membrane 120 may have a free-floating membrane structure in which the vibration membrane 120 is fixed by a frictional force between the CNT support posts 140 but a contact point with respect to the CNT support post 140 or the substrate 110 is not mechanically or chemically attached.

That is, in the related art, the free-floating membrane is not fixed so it is damaged by an impact in a non-driving state without an applied voltage.

In contrast, in an exemplary embodiment of the present disclosure, even in a non-driving state without an applied voltage, the vibration membrane 120 is fixed mechanically by a frictional force of the CNT support post 14, whereby the damage problem is solved and high durability is provided.

FIG. 4 is a cross-sectional view illustrating an operation principle of a microphone when a sound pressure is input according to an exemplary embodiment of the present disclosure.

Referring to FIG. 4, a CNT support post 140 according to an exemplary embodiment of the present disclosure serves as a spring through adjustment of rigidity of a columnar CNT, and for the purposes of description, the CNT support post 140 is illustrated as a spring.

The vibration membrane 120 is fixed to the substrate 110 by the CNT support post 140 and horizontally disposed in a non-driving state.

When a sound pressure is input in a driving state, the vibration membrane 120 is vibrated by the sound pressure, causing a space between the vibration membrane 120 and the fixed membrane 130 to be changed, and thus, capacitance between the vibration membrane 120 and the fixed membrane 130 is changed.

In particular, the CNT support 140 is deformed by the sound pressure together with the vibration membrane 120 to increase a vibration displacement of the vibration membrane 120.

That is, a displacement due to the role of the CNT support post 140 as a spring is added to a displacement of the vibration membrane 120 due to the sound pressure to increase an overall vibration displacement, whereby a vibration width between the vibration membrane 120 and the fixed membrane 130 is increased to increase a change in capacitance.

The increased capacitance is transferred through a pad (not shown) and a conducting wire connected to each of the fixed electrode 133 and the vibration membrane 120 and converted into an electrical signal by a circuit (not shown) for signal processing to sense a sound from the outside, thereby implementing a high sensitivity microphone 100.

Figure 5:
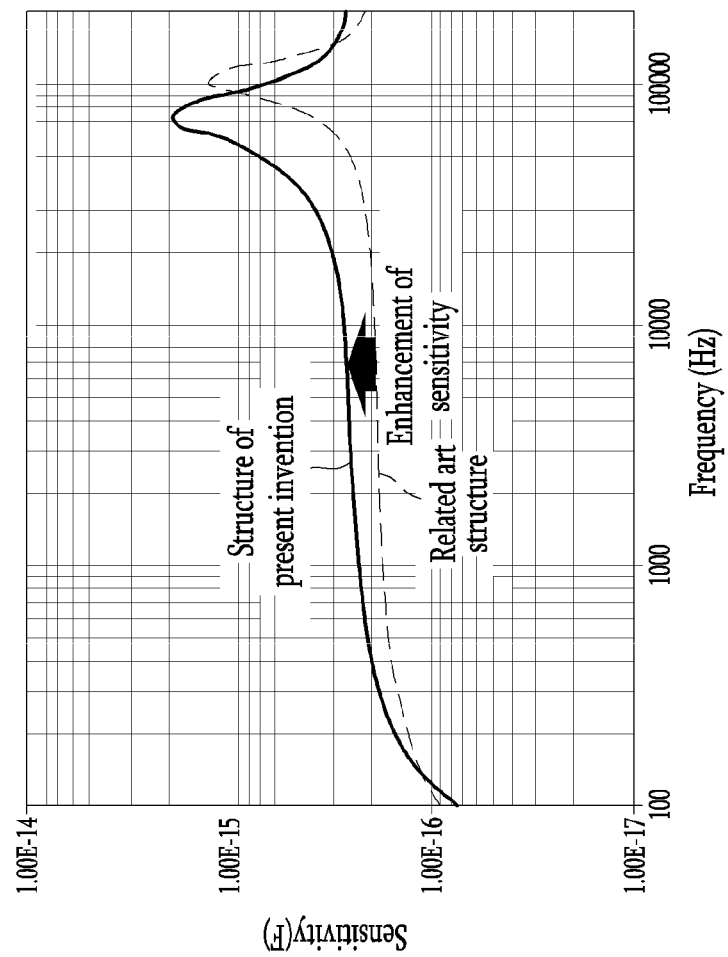
FIG. 5 is a graph illustrating result of comparison and verification of sensitivity between a microphone structure according to an exemplary embodiment of the present disclosure and a related art structure.

FIG. 5 is a graph illustrating result of comparison and verification of sensitivity between a microphone structure according to an exemplary embodiment of the present disclosure and a related art structure.

Referring to FIG. 5, the related art support post 4 as illustrated in FIG. 1 merely serves as a fixed end as a rigidity structure, which is not easy to adjust rigidity thereof, leading to a difficulty in additionally enhancing sensitivity.

In contrast, the CNT support post 140 according to an exemplary embodiment of the present disclosure serves as a spring with elasticity simultaneously deformed with the vibration membrane 120 by a sound pressure, further increasing vibration displacement when the vibration membrane 120 is vibrated by a sound pressure, thus resultantly obtaining enhancement of sensitivity.

A method for manufacturing the high sensitivity microphone 100 according to an exemplary embodiment of the present disclosure will be described with reference to the accompanying drawings.

FIGS. 6 to 12 are views illustrating a method for manufacturing a microphone according to an exemplary embodiment of the present disclosure.

Figure 6:
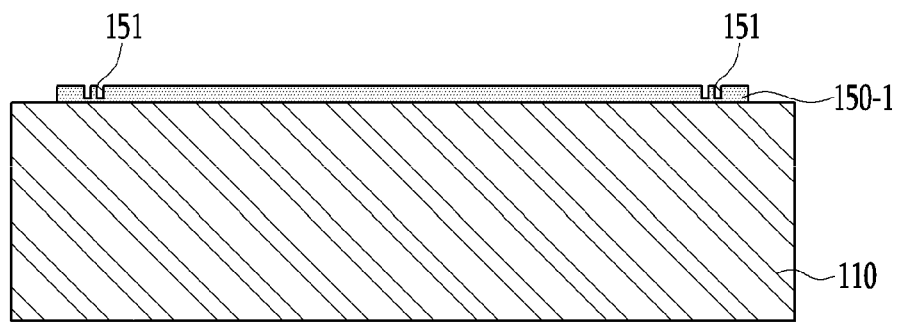
FIGS. 6 to 12 are views illustrating a method for manufacturing a microphone according to an exemplary embodiment of the present disclosure.

Referring to FIG. 6, after a substrate 110 is prepared, a first sacrificial layer 150-1 is formed on the substrate 110 and partially etched to pattern a recess 151 for formation of a depression and protrusion portion 121 of a vibration membrane 120. Here, the substrate 110 may be formed of silicon.

The first sacrificial layer 150-1 may be formed of any one of a photosensitive material, a silicon oxide, and a silicon nitride. The photosensitive material may have a thermally and mechanically stable structure and may be easily removed in terms of process.

Figure 7:
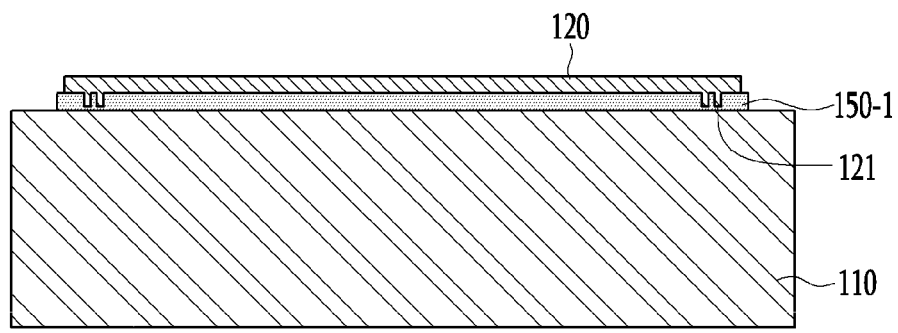

Referring to FIG. 7, the vibration membrane 120 is formed on an upper portion of the first sacrificial layer 150-1.

Here, a depression and protrusion portion 121 is formed under the vibration membrane 120 along the recess 151 formed on the first sacrificial layer 150-1.

Here, the vibration membrane 120 may be formed as a monolayer membrane using polysilicoin or a silicon nitride film. Without being limited thereto, the vibration membrane 120 may also be formed as a multi-layer by alternately stacking polysilicon and a silicon nitride film.

Figure 8:
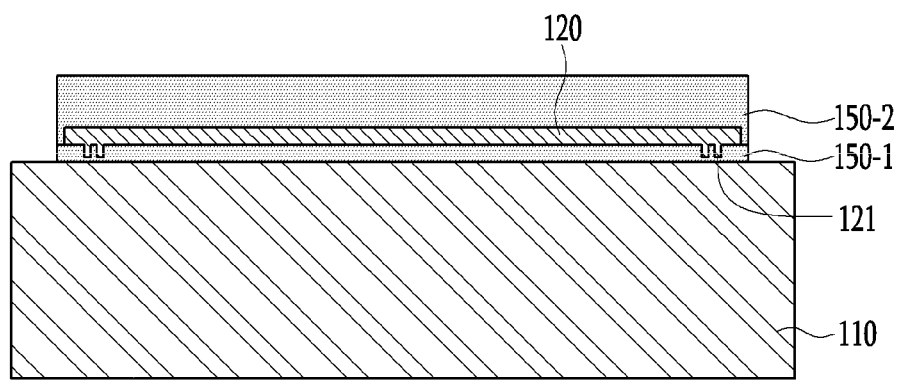

Referring to FIG. 8, a second sacrificial layer 150-2 is formed on the vibration membrane 120 and the first sacrificial layer 150-1. Here, the second sacrificial layer 150-2 may be formed of the same material as that of the first sacrificial layer 150-1 and may have a thickness for forming an air layer 131.

Figure 9:
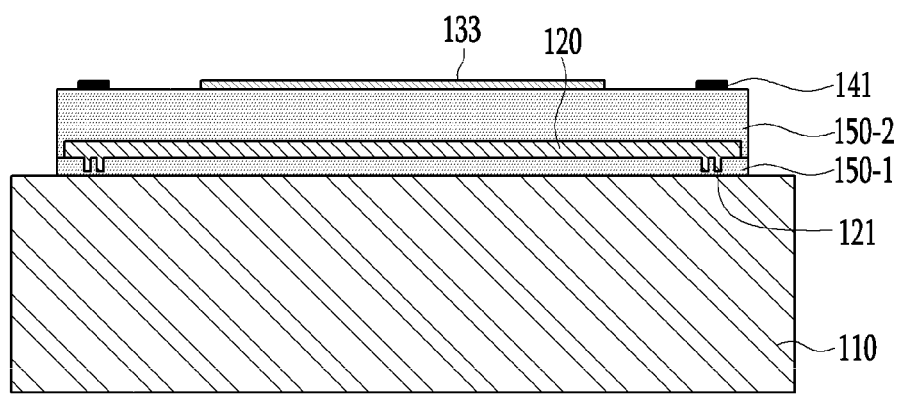

Referring to FIG. 9, a CNT (seed metal) 141 for growing a CNT support post 140 later is patterned on both side portions of the second sacrificial layer 150-2, and a fixed electrode 133 formed under a fixed membrane 130 later is patterned in a central portion of the second sacrificial layer 150-2. Here, the fixed electrode 133 may be patterned by a polysilicon.

Figure 10:
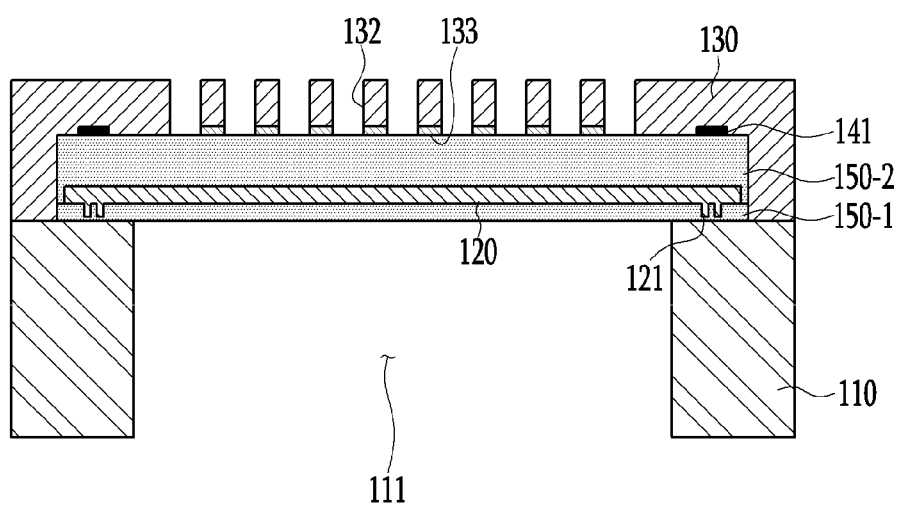

Referring to FIG. 10, the fixed membrane 130 is formed on the substrate 100 including the CNT seed 141, the fixed electrode 133, and the second sacrificial layer 150-2.

The fixed membrane 130 may have a "U" shape and cover the entire area of the substrate 110.

Here, the fixed membrane 130 may be formed by depositing a silicon nitride (SiN). In another exemplary embodiment, the fixed membrane 130 may be formed by depositing polysilicon.

Thereafter, the fixed membrane 130 and the fixed electrode 133 positioned thereunder are etched to generate a plurality of air inlets 132 perforated in the same pattern.

Here, the plurality of air inlets 132 may be formed through dry etching or wet etching, and etching is performed until the second sacrificial layer 150-2 is exposed in a vertical direction in which the vibration membrane 120 is formed.

In addition, a rear surface of the substrate 110 is etched until the first sacrificial layer 150-1 is exposed to form a through portion 111 to which a sound pressure is input from the outside.

Figure 11:
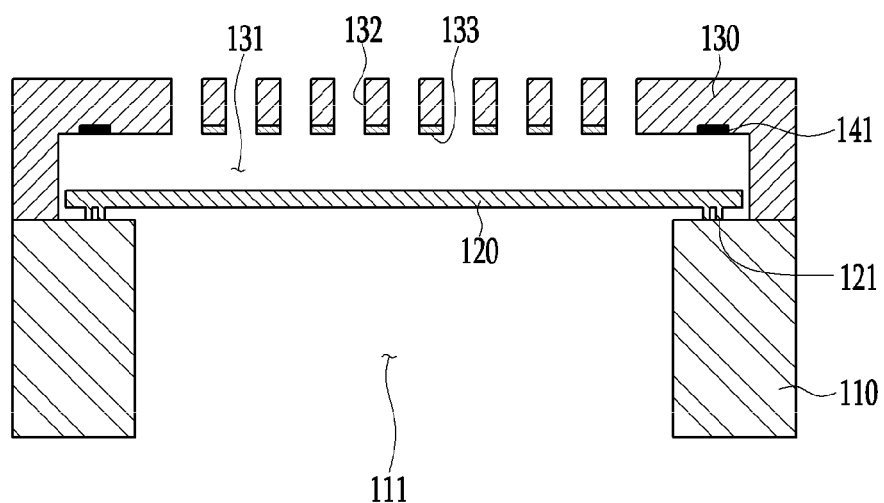

Referring to FIG. 11, the second sacrificial layer 150-2 and the first sacrificial layer 150-1 are removed to form an air layer 131 between the vibration membrane 120 and the fixed membrane 130.

The sacrificial layers 150 may be removed through a wet etching method using an etchant through the air inlet 132. Also, the sacrificial layers 150 may be removed through a dry etching method by performing ashing based on oxygen ($O_2$) plasma through the air inlet 132.

When the sacrificial layers 150 are removed through the wet or dry etching method, the air layer 131 is formed and the vibration membrane 120 is placed in a non-attached state on the substrate 110.

Figure 12:
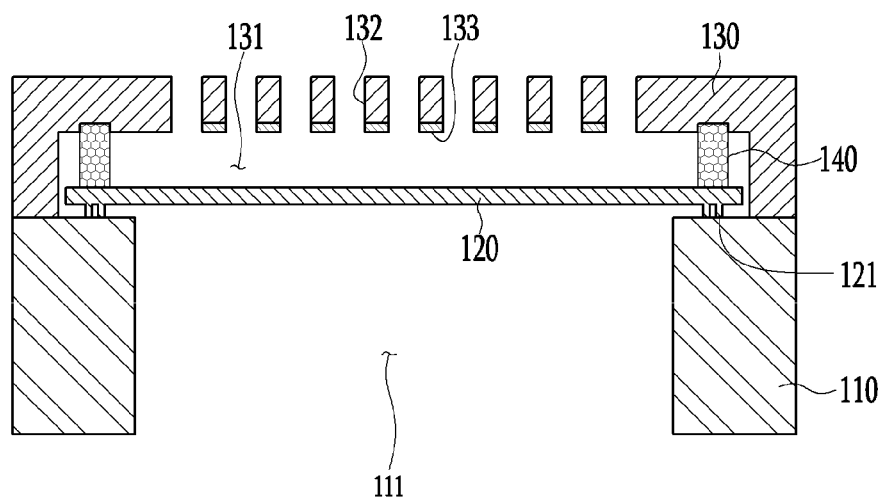

Referring to FIG. 12, when the sacrificial layers are entirely removed, the CNT seed 141 is grown to form the CNT support post 140.

Columnar end portions of the plurality of CNT support posts 140 are lowered to be in contact with upper portions of the vibration membrane 120 positioned not to be attached to the substrate 110, thereby mechanically fixing the vibration membrane 120 by a frictional force.

Thereafter, although not shown, the fixed electrode 133 of the fixed membrane 130 and a vibration electrode of the vibration membrane 120 may be electrically connected to a circuit for signal processing through a pad and a conducting wire thereof.

The microphone and the manufacturing method thereof according to exemplary embodiments of the present disclosure described above are not limited to the aforementioned process (flow) but may be variously modified.

For example, in FIG. 10, it is illustrated and described that the plurality of air inlets 132 are formed, and thereafter, the through portion 111 is formed on a rear side of the substrate 110, but the manufacturing method of the present disclosure is not limited to the order of the description. For example, the process of forming the through hole 111 on the rear side of the substrate 110 may also be performed before the formation of the air inlets 132 or after the sacrificial layers 150 of FIG. 11 are removed.

In this manner, according to an exemplary embodiment of the present disclosure, since the patterned CNT support posts are formed between the fixed membrane and the vibration membrane to mechanically fix the vibration membrane by a frictional force of the CNT support post, regardless of an applied voltage, an impact applied to the vibration membrane may be prevented and durability may be enhanced.

Since the patterned CNT support posts serve as springs with a structure having optimized rigidity to increase vibration displacement when the vibration membrane is vibrated by a sound pressure, an effect of enhancing sensitivity may be maximized.

In addition, application of high durability and high sensitivity microphone according to an exemplary embodiment of the present disclosure to a vehicle may enhance performance of electronic equipment based on sound recognition, whereby enhancement of customer satisfaction of products may be anticipated.

The exemplary embodiments of the present disclosure may not necessarily be implemented only through the foregoing devices and/or methods but may also be implemented through a program for realizing functions corresponding to the configurations of the embodiments of the present disclosure, a recording medium including the program, or the like, and such an implementation may be easily made by a skilled person in the art to which the present disclosure pertains from the foregoing description of the embodiments.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

What is claimed is:

1. A method for manufacturing a high sensitivity microphone, the method comprising:
   a) forming a first sacrificial layer on a substrate and forming a vibration membrane thereon;
   b) forming a second sacrificial layer on the vibration membrane and patterning carbon nanotube (CNT) seeds on opposing sides of the second sacrificial layer;
   c) forming a fixed membrane on the substrate including the CNT seeds and the second sacrificial layer;
   d) etching the fixed membrane to generate a plurality of perforated air inlets; and
   e) removing the first sacrificial layer and the second sacrificial layer and growing the CNT seeds to form a plurality of CNT support posts as vertical elastic posts between the fixed membrane and the vibration membrane to mechanically fix the vibration membrane by a frictional force, regardless of an applied voltage.

2. The method of claim 1, wherein operation a) comprises:
   etching a portion of the first sacrificial layer to pattern a plurality of recesses; and
   forming a depression and protrusion portion by the plurality of recesses formed in the first sacrificial layer under the vibration membrane.

3. The high sensitivity microphone of claim 1, wherein operation d) comprises:
   etching a rear side of the substrate to form a through portion to which a sound pressure is input from the outside.

4. The method of claim 1, wherein
   the vibration membrane includes a monolayer membrane formed of polysilicon or a silicon nitride or a multilayer membrane formed by alternately stacking polysilicon and a silicon nitride.

5. The method of claim 1, wherein
   the first sacrificial layer and the second sacrificial layer are formed of any one of a photosensitive material, a silicon oxide, and a silicon nitride.

6. The method of claim 1, wherein operation e) comprises:
   removing the first sacrificial layer to position the vibration membrane in a state of not being attached to the substrate; and
   fixing the vibration membrane positioned in a non-attached manner on the substrate by a frictional force of the CNT support posts.

7. The method of claim 1, wherein operation b) comprises:
   patterning a fixed electrode in a central portion of the second sacrificial layer.

8. The method of claim 7, wherein in operation d),
   the fixed membrane and the fixed electrode are etched to generate a plurality of air inlets perforated in the same pattern.

* * * * *